United States Patent
Kraska et al.

(10) Patent No.: US 6,579,661 B1
(45) Date of Patent: Jun. 17, 2003

(54) PHOTOPOLYMERIZABLE COMPOSITION FOR THE PRODUCTION OF FLEXOGRAPHIC PRINTING FORMS FOR CORRUGATED BOARD PRINTING

(75) Inventors: Ursula Kraska, Weiterstadt (DE); Reimund Simon, Birstein (DE)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 09/009,597

(22) Filed: Jan. 20, 1998

(51) Int. Cl.$^7$ .............................. G03C 1/73; G03C 1/76; G03F 7/028; G03F 7/032; C08F 2/48
(52) U.S. Cl. .................... 430/281.1; 430/283.1; 430/285.1; 430/273.1; 430/905; 430/907; 430/912; 522/109; 522/142; 522/144
(58) Field of Search .................... 430/286.1, 287.1, 430/907, 912, 285.1, 283.1, 281.1, 273.1, 905; 522/109, 142, 144

(56) References Cited

U.S. PATENT DOCUMENTS

| | | | | |
|---|---|---|---|---|
| 3,639,521 A | * | 2/1972 | Hsieh | 260/880 |
| 3,700,748 A | | 10/1972 | Winkler | 525/314 |
| 4,089,824 A | * | 5/1978 | Bronstert et al. | 524/534 |
| 4,126,466 A | | 11/1978 | Roos | |
| 4,162,919 A | | 7/1979 | Richter et al. | 96/87 |
| 4,197,130 A | | 4/1980 | Nakamura et al. | 430/286 |
| 4,259,220 A | | 3/1981 | Bunnelle et al. | 525/98 |
| 4,266,005 A | * | 5/1981 | Nakamura et al. | 430/271 |
| 4,320,188 A | * | 3/1982 | Heinz et al. | 430/281 |
| 4,430,417 A | * | 2/1984 | Heinz et al. | 430/286 |
| 4,460,675 A | | 7/1984 | Gruetzmacher et al. | 430/300 |
| 4,772,657 A | * | 9/1988 | Akiyama et al. | 524/504 |
| 5,112,725 A | | 5/1992 | Kurtz et al. | 430/306 |
| 5,213,948 A | * | 5/1993 | Abele | 430/273.1 |
| 5,250,389 A | | 10/1993 | Nakamura et al. | 430/286.1 |
| 5,292,819 A | * | 3/1994 | Diehl et al. | 525/314 |
| 5,380,798 A | * | 1/1995 | Onishi et al. | 525/89 |
| 5,393,818 A | * | 2/1995 | Masse et al. | 525/93 |
| 5,422,225 A | | 6/1995 | Southwick et al. | 430/270 |
| 5,472,824 A | | 12/1995 | Schober et al. | 430/309 |
| 5,571,883 A | * | 11/1996 | Jourdain et al. | 526/282 |

FOREIGN PATENT DOCUMENTS

| | | | | |
|---|---|---|---|---|
| EP | 0696761 | | 2/1996 | G03F/7/038 |
| GB | 1366769 | * | 9/1974 | C08F/1/20 |
| WO | 95/08136 | | 3/1995 | G03F/7/033 |

OTHER PUBLICATIONS

Kirk Othmer's *Enclycopedia of Chemical Technology* (4th Edition) (vol. 7, p. 368/vol. 9, p. 16–17/vol. 19, p. 886–887, 1993.*

* cited by examiner

*Primary Examiner*—Janet Baxter
*Assistant Examiner*—Sin J. Lee
(74) *Attorney, Agent, or Firm*—Thomas H. Magee

(57) ABSTRACT

A photopolymerizable composition for the preparation of flexographic printing forms for corrugated board direct printing comprising a radial (polystyrene-polybutadiene)$_n$X block copolymer, with X=Sn or Si and n=2 or 4, with an average molecular weight ($M_w$) of 80,000–300,000, a molecular weight distribution ($M_w/M_n$) of 1.00–1.40, a content of di- block copolymers of less than 15% by weight, which is extended with up to 50% by weight of a paraffinic oil.

10 Claims, No Drawings

PHOTOPOLYMERIZABLE COMPOSITION FOR THE PRODUCTION OF FLEXOGRAPHIC PRINTING FORMS FOR CORRUGATED BOARD PRINTING

BACKGROUND OF THE INVENTION

1. Field of the Invention

This invention pertains to a photopolymerizable composition comprising an elastomeric binder, a photopolymerizable ethylenically unsaturated monomer and a photoinitiator; a photopolymerizable printing plate comprising at least one photopolymerizable layer consisting of such a composition; and a flexographic printing form made from the photopolymerizable printing plate.

2. Description of Related Art

It is known to use photopolymerizable printing plates for the preparation of flexographic printing forms, whereby the printing surface is produced by imagewise exposure of a photopolymerizable layer with actinic radiation, and subsequent removal of unexposed, non-photopolymerized areas of the printing plate. Examples are disclosed in the following patents: DE-C 22 15 090, U.S. Pat. Nos. 4,266,005; 4,320,188; 4,126,466 and 4,430,417. Such photopolymerizable printing plates usually consist of a support, an optional adhesive or other auxiliary layer, one or more photopolymerizable layers, optionally an elastomeric layer, and a cover layer.

A preferred process of making multilayer, photopolymerizable printing plates is one in which a previously extruded photopolymerizable composition is fed into the nip of a calender and is calendered between a support and a cover element to form a photopolymerizable layer. EP-B 0 084 851 discloses a process for making multilayer, photopolymerizable printing plates having a further elastomeric layer between the flexible tear-resistant polymeric layer and the photopolymerizable layer.

The photopolymerizable layers contain polymeric binders, photopolymerizable monomers, photoinitiators and further additives like plasticizers, fillers, stabilizers, etc. Usually thermoplastic, elastomeric block copolymers are used as polymeric binders, like those described in DE-C 22 15 090. These are normally A-B-A block copolymers with thermoplastic blocks A and elastomeric blocks B, especially linear and radial block copolymers with polystyrene end blocks, i.e. polystyrene-polyisoprene-polystyrene, (polystyrene-polyisoprene)$_4$Si or the corresponding butadiene polymers.

Often, printing forms made according to the state of the art do not meet all requirements. Especially in corrugated board direct printing, problems occur again and again. The deep relief printing forms used for corrugated board printing have to show a high cohesion in the photopolymer to prevent break out of halftone dots, especially of isolated dots, and to anchor them securely on the printing form. The same is true for fine lines, which additionally are not allowed to be reproduced in waves, i.e., have the form of waves. Simultaneously, the printing forms have to be soft enough to avoid the so-called "wash-board effect" for solids. A varying compressible wave profile and very rough print materials, like often used recycling papers, further complicate a uniform color transfer. The production of such printing forms, which show this combination of deep relief, stable dots and lines, good color transfer and required softness for good solids, is often expensive, and the reproducibility of plate properties is not very good. The printing plates of the state of the art especially show cold flow which makes storage and handling more difficult.

SUMMARY OF THE INVENTION

The present invention provides flexographic printing forms, especially for corrugated board direct printing, which do not show the disadvantages of printing forms according to the state of the art. The photopolymerizable printing plates for production of such flexographic printing forms show higher photosensitivity, without other essential properties of the photopolymerizable printing plates or of the flexographic printing forms being negatively influenced.

This objective was surprisingly solved by a photopolymerizable composition for a photopolymerizable printing plate comprising at least one elastomeric binder, at least one photopolymerizable, ethylenically unsaturated compound, and at least one photoinitiator or photoinitiator system, characterized in that the composition contains at least one radial (polystyrene-polybutadiene)$_n$X block copolymer, with X=Sn or Si and n=2 or 4, with an average molecular weight ($M_w$) of 80,000–300,000, a molecular weight distribution ($M_w/M_n$) of 1.00–1.40, a content of diblock copolymers of less than 15% by weight, which is extended with up to 50% by weight of a paraffinic oil. The invention also comprises a flexographic printing form made from such a photopolymerizable composition.

DESCRIPTION OF THE PREFERRED EMBODIMENT(S)

Surprisingly, the production process of photopolymerizable printing plates is simplified by the use of the polymers according to this invention. Products which are more stable and with better reproducibility of properties of the printing plates and forms, which are essential for corrugated board direct printing, are provided. Furthermore, the photosensitivity of photopolymerizable printing plates is enhanced so that shorter exposure times for imagewise main exposure as well as for overall back exposure are possible. A special advantage of the materials according to the invention is a high Shore A hardness of the non-photopolymerized printing plates and simultaneously a low Shore A hardness of the photopolymerized printing forms when compared to state-of-the-art printing plates. Therefore, the printing plates of the invention show lower cold flow than printing plates of the state-of-the-art without loss of the necessary softness for printing forms. The Shore A hardness of the non-photopolymerized composition or printing plate is $\geq 20$, the Shore A hardness of the photopolymerized composition or printing form is $\leq 40$, preferably $\leq 38$, and the difference between the Shore A hardness of the photopolymerized material and the Shore A hardness of the non-photopolymerized material is $\leq 22$, preferably $\leq 20$. Printing forms made of the materials according to the invention also show good color transfer.

Radial (polystyrene-polybutadiene)$_n$X block copolymers, with X=Sn or Si and n=2 or 4, are used as polymers essential for the invention, preferably (polystyrene-polybutadiene)$_4$Si block copolymers are used. These polymers have an average molecular weight ($M_w$) of 80,000–300,000, preferably 100,000–250,000, and a molecular weight distribution ($M_w/M_n$) of 1.00–1.40, preferably 1.00–1.25. The polymers essential for the invention contain less than 15% by weight of di-block copolymers, preferably less than 10% by weight. Furthermore, the polymers are extended with up to 50% by weight, preferably 25–40% by weight, of one or more paraffinic oils. These paraffinic oils preferably contain less than 10% by weight of aromatic compounds. The polystyrene content of the polymers of the present invention is 10–40% by weight, preferably 15–35% by weight. Especially (polystyrene-polybutadiene)$_4$Si block copolymers with an average molecular weight ($M_w$) of 150,000–200,000, a content of di-block copolymers of less than 10% by weight, which are extended with 25–35% by weight of a paraffinic oil, are preferred.

Preferably, the block copolymers of the invention are used as the sole binders of a photopolymerizable composition for a photopolymerizable printing plate. But they can also be used as mixtures with other thermoplastic, elastomeric block copolymers, if special requirements to plate properties demand this. In this case, the amount of polymers essential for this invention is not below 30% by weight, preferably greater than or equal to ($\geq$) 50% by weight, especially preferred greater than or equal to ($\geq$) 70% by weight, based on the total amount of polymeric binders.

Especially suitable as further block copolymers are those disclosed in DE-C 22 15 090; U.S. Pat. No. 4,320,188; U.S. Pat. No. 4,197,130; U.S. Pat. No. 4,430,417 or U.S. Pat. No. 4,162,919. Especially linear and radial block copolymers with polystyrene end blocks, i.e., polystyrene-polybutadiene-polystyrene, (polystyrene-polybutadiene)$_4$Si or the corresponding isoprene polymers, are suitable as binders, as long as they are compatible with the polymers essential for this invention. Especially preferred are polybutadiene containing polymers. The average molecular weight $M_w$ of the block copolymers usually is 80,000–300,000, preferably 100,000–250,000. A polystyrene content of 10–40% by weight is advantageous, especially a content of 15–30% by weight. The polymers of the invention can be used in one or more of the photopolymerizable layers of a photopolymerizable printing plate. Also the combination with additional printing layers as described in EP-B 0 084 851 is possible.

Known mono- or poly-unsaturated monomers, like esters or amides of acrylic or methacrylic acid with mono- or polyfunctional alcohols, amines, amino alcohols or hydroxy ethers and esters, are used as ethylenically unsaturated compounds in the photopolymerizable compositions and printing plates. Also suitable are mixtures of mono- and poly-saturated compounds as those disclosed in DE-C1 37 44 243 and DE-A 36 30 474. Examples are: butyl acrylate, isodecyl acrylate, tetradecyl acrylate, lauryl acrylate, polyethoxylated acrylates, as for example, polyoxyethylenic 4-nonylphenyl acrylate, 2-hexyloxyethyl acrylate, 1,4-butanediol diacrylate, 1,6-hexanediol diacrylate, trimethylolpropane triacrylate and dipentaerythritol monohydroxy pentacrylate, as well as the corresponding methacrylates.

Furthermore, the photopolymerizable compositions and layers contain a known photoinitiator or photoinitiator system, such as for example, O-methyl benzoin, benzoin acetate, benzophenone, benzildimethyl ketal, ethyl anthraquinone/4,4'-bis-(dimethylamino)-benzophenone.

The photopolymerizable compositions and layers generally contains 60–80% by weight of binder or binder mixture, 5–30% by weight of monomer or monomer mixture, and 0.5–5% by weight of initiator. Further additives like filler, dyes, antioxidants, ozone protectants, thermal inhibitors, and plasticizers can be contained in usual amounts. Preferably 1–25% by weight of plasticizers are added. The thickness of the photopolymerizable layers is 2.8–9.0 mm, preferably 3.5–7.0 mm.

Foils of various film forming synthetic polymers are suitable as supports for the photopolymerizable printing plates of the invention. Polyester and polyester-polyamid foils, optionally coated with an adhesion layer and/or anti-halation layer are preferred, especially polyethylene terephthalate foils.

All commonly used foils are suitable as cover sheet, for example polystyrene, polyethylene, polypropylene or polyethylene terephthalate.

Optionally a thin, non-tacky polymer layer, which can be removed with the developer solvent, is present under the cover sheet. Preferably polyamides, copolymers of ethylene and vinyl acetate or similar polymers, which form transparent and tear-resistant films, are used. The thickness of these layers is 0.0025–0.038 mm.

Photopolymerizable printing plates according to the invention are produced by common processes. Preferably, the photopolymerizable composition is extruded and then calendered between the support and a cover element. This process is disclosed in EP-B1 0 084 851. The cover element can consist solely of a cover foil, or additionally of an elastomeric layer and/or a flexible polymer layer as already described.

The photopolymerizable printing plate is imagewise exposed through a negative by common processes, whereby the cover layer of the photopolymerizable printing plate is usually stripped before the imagewise exposure. Any actinic radiation can be used for production of the flexographic printing forms. Suitable radiation sources are for example mercury vapor lamps, fluorescent lamps with special UV-light emitting phosphors, argon glow lamps, and photographic flood lamps. Of these, mercury vapor lamps, especially UV-light lamps and UV-fluorescent lamps, are most suitable. An overall back exposure may be conducted before or after the imagewise exposure. This exposure may be done diffused or directed. All radiation sources suitable for imagewise exposure may be used.

Wash-off of the non-photopolymerized areas of the printing plate may be accomplished with suitable development solvents, for example aliphatic or aromatic hydrocarbons such as n-hexane, petrol ether, hydrated petrol oils, limonene or other terpenes or toluene, isopropyl benzene, etc., ketones such as methyl ethyl ketone, halogenated hydrocarbons such as chloroform, trichloroethane, or tetrachloroethylene, esters such as acetic acid or acetoacetic acid esters, or mixtures of these solvents. Additives such as surfactants or alcohols may be used. After drying, the printing forms may be post exposed and/or chemically or physically aftertreated in any sequence.

The following examples shall further clarify the present invention. The shown parts and percentages are based on weight, if nothing else is shown. The determination of the average molecular weights $M_W$, of the molecular weight ratios ($M_w/M_n$) and of the content of di- block copolymers was done by Gel Permeation Chromatography (GPC) after solution of the polymers in THF by use of polystyrene-divinylbenzene columns (200–3,000,000) and a UV- (254 nm) and RI-detector (37° C.). Polystyrene standards with average molecular weights $M_w$ in the range of 5,050–1,033,000 were used for calibration. The hardness of the printing plates and forms was measured as Shore A according to DIN 53.505. For determination of photosensitivity, the printing plates were overall exposed from the backside for a) 60–120 sec. in steps of 10 sec., b) 20–40 sec. in steps of 5 sec., and c) 50–650 sec. in steps of 150 sec., developed, and dried. The resulting floor was measured.

EXAMPLES

Example 1

70.13% by weight of a radial, oil-extended (31% by weight of paraffinic oil with <10% by weight aromatic compounds) (polystyrene-polybutadiene)$_4$Si block copolymer with an average molecular weight $M_w$ of 170,000, a molecular ratio ($M_w/M_n$) of 1.2, 30% by weight of polystyrene and with less than 10% by weight of diblock copolymers, 5.5% by weight of hexamethylene glycol diacrylate, 21.46% by weight of polybutadiene ($M_w$ 3500), 1.0% by weight of polyethoxylated 4-nonylphenol acrylate (4 Mol ethylene oxide), 1.41% by weight of Irgacure 651, 0.5% by weight of 2,6-di-tert.-butyl-4-methyl phenol and 0.001% by weight of a common dye were kneaded in a labor dough mixer (Werner & Pfleiderer, Type LUK 025) at approximately 145° C. After cooling of the melt, the composition was pressed into photopolymerizable printing plates between two polyester foils in a labor press (140° C., 23 bar). Plates with a thickness of 6.35 mm, of 5.60 mm as well as of 4.32 mm were produced. The raw hardnesses of these plates were determined. Then the plates were produced in the way usual for photopolymeric flexographic printing plates, (i.e., exposed, washed off with FlexoSol® by DuPont, and postexposed, as described in EP-B 0 084 851, Example 1). The photosensitivities and the Shore A hardnesses of the printing plates and forms are summarized in Tables 1, 2, 3 and 4.

In each case a two-color subject comprising critical image elements, like fine positive lines (0.25 mm) and screens (34 1/cm) and isolated dots, was printed during test prints. The results showed optimized printing of full color areas and good reproduction of fine image elements without washboard effect. All further properties of the printing forms were not negatively influenced. Corresponding tests with comparable results were repeated with materials from different sets.

Comparative Example

A printing plate and form was prepared, processed and examined as described in Example 1. Instead of the polymer according to the present invention, a linear, oil extended (30–33% by weight of white mineral oil) polystyrene-polybutadiene-polystyrene block copolymer with an average molecular weight $M_w$ of 190,000 and 31% by weight of polystyrene was used. The plate thickness was 5.60 mm. The results are summarized in Tables 3 and 4.

TABLE 1

Plate Sensitivity according to a)
Plate Thickness 6.35 mm

| Back Exposure (sec) (1.65 J/min) | 60 | 70 | 80 | 90 | 100 | 110 | 120 |
|---|---|---|---|---|---|---|---|
| Floor (mm) | 3.55 | 3.85 | 4.04 | 4.28 | 4.43 | 4.47 | 4.77 |

TABLE 2

Plate Sensitivity according to b)
Plate Thickness 4.32 mm

| Back Exposure (sec) (1.65 J/min) | 20 | 25 | 30 | 35 | 40 |
|---|---|---|---|---|---|
| Floor (mm) | 1.92 | 2.20 | 2.24 | 2.58 | 2.60 |

TABLE 3

Plate Sensitivity according to c)
Plate Thickness 5.60 mm

| Back Exposure (sec) (0.95 J/min) | 50 | 200 | 350 | 500 | 650 |
|---|---|---|---|---|---|
| Floor (mm) | | | | | |
| Example 1 | 1.75 | 2.69 | 3.58 | 3.99 | 4.17 |
| Comparison | 1.19 | 1.56 | 1.88 | 2.08 | 2.20 |

TABLE 4

Shore A Hardness

| Plate Thickness [mm] | Hardness (Shore A) | | |
|---|---|---|---|
| | Raw | Exposed | Δ |
| 4.32 | 21.3 | 37.8 | 16.5 |
| 5.60 | 20.0 | 37.0 | 17.0 |
| Comparison | 10.0 | 33.0 | 23.0 |
| 6.35 | 20.0 | 36.2 | 16.2 |

What is claimed is:

1. A photopolymerizable composition comprising:
   a) at least one elastomeric binder,
   b) at least one ethylenically unsaturated monomer, and
   c) a photoinitiator or photoinitiator system,
characterized in that the at least one elastomeric binder comprises at least one radial (polystyrene-polybutadiene)$_n$X block copolymer, with X=Sn or Si and n=4, with an average molecular weight ($M_w$) of 80,000–300,000, a molecular weight distribution ($M_w/M_n$) of 1.00–1.40, a content of di-block copolymers of less than 15% by weight based upon the total weight of the polymer, which is extended with a paraffinic oil which must be present up to 50% by weight based upon the total weight of the polymer and paraffinic oil, wherein the durometer of the non-photopolymerized composition has a Shore A hardness ≧20 and the durometer of the photopolymerized composition has a Shore A hardness ≦40.

2. The photopolymerizable composition according to claim 1, characterized in that the molecular weight distribution ($M_w/M_n$) is 1.00–1.25.

3. The photopolymerizable composition according to claim 1, characterized in that the radial (polystyrene-polybutadiene)$_n$X block copolymer has an average molecular weight ($M_w$) of 100,000–250,000.

4. The photopolymerizable composition according to claim 1, characterized in that the radial (polystyrene-polybutadiene)$_n$X block copolymer is extended with 25–40 weight % of a paraffinic oil based upon the total weight of the polymer and paraffinic oil.

5. The photopolymerizable composition according to claim 1, characterized in that the paraffinic oil contains less than 10% by weight of aromatic compounds based upon the total weight of the paraffinic oil and aromatic compounds.

6. The photopolymerizable composition according to claim 1, characterized in that the radial (polystyrene-polybutadiene)$_n$X block copolymer contains less than 10% by weight of di-block copolymers based upon the total weight of the polymer.

7. The photopolymerizable composition according to claim 1, characterized in that the radial (polystyrene-polybutadiene)$_n$X block copolymer is the sole polymeric binder.

8. The photopolymerizable composition according to claim 1, characterized in that the difference between the durometer of the photopolymerized composition and the durometer of the non-photopolymerized composition measured as Shore A hardness is ≦22.

9. A photopolymerizable printing plate comprising a support, at least one photopolymerizable layer and a cover element, characterized in that the photopolymerizable layer consists of a photopolymerizable composition according to claim 1.

10. The photopolymerizable printing plate according to claim 9, characterized in that a further polymeric layer exists between the photopolymerizable layer and the cover element.

* * * * *

UNITED STATES PATENT AND TRADEMARK OFFICE
CERTIFICATE OF CORRECTION

PATENT NO. : 6,579,661 B1
DATED : June 17, 2003
INVENTOR(S) : Ursula A. Kraska and Reimund Simon It is certified that error appears in the above-identified patent and that said Letters Patent is hereby corrected as shown below:

<u>Title page,</u>
After Item [22], please insert the following:
-- [30] Foreign Application Priority Data
    February 3, 1997 [DE]  Fed. Rep. of Germany ….. 19703917.0 --

Signed and Sealed this

Seventeenth Day of February, 2004

JON W. DUDAS
*Acting Director of the United States Patent and Trademark Office*